United States Patent [19]
Utsumi et al.

[11] Patent Number: 5,495,822
[45] Date of Patent: Mar. 5, 1996

[54] METHOD OF SELECTIVELY GROWING SI EPITAXIAL FILM

[75] Inventors: Yuichi Utsumi; Housei Akazawa, both of Kanagawa, Japan

[73] Assignee: Nippon Telegraph and Telephone Corporation, Japan

[21] Appl. No.: 279,231

[22] Filed: Jul. 22, 1994

[30] Foreign Application Priority Data

Aug. 10, 1993 [JP] Japan ................................. 5-216945

[51] Int. Cl.$^6$ ................................................. C30B 25/02
[52] U.S. Cl. ..................................... 117/1; 117/84; 117/92
[58] Field of Search .................................. 117/1, 84, 92, 117/100; 148/DIG. 152, DIG. 158; 437/11

[56] References Cited

U.S. PATENT DOCUMENTS

| | | | |
|---|---|---|---|
| 4,116,751 | 9/1978 | Zaromb | 117/89 |
| 4,177,321 | 12/1979 | Nishizawa | 437/84 |

OTHER PUBLICATIONS

Hiroyuki Hirayama, Toru Tatsumi and Naoaki Aizaki, "Selective Growth Condition in Disilane Gas Source Silicon Molecular Beam Epitaxy", Appl. Phys. Lett., vol. 52, No. 26, 27, Jun. 1988, pp. 2242 and 2243.

H. Akazawa, Y. Utsumi, J. Takahashi and T. Urisu, "Photo-stimulated Evaporation of SiO2 Films by Synchrotron Radiation", Appl. Phys. Lett. vol. 57, No. 22, 26, Nov. 1990, pp. 2302–2304.

Y. Utsumi, H. Akazawa, M. Nagase T. Urisu and I. Kawashima, "Selective Growth in Synchrotron Radiation Excited Si Epitaxy", Appl. Phys. Lett., vol. 62, No. 14, 5, Apr. 1993, pp. (title page and) 1647–1649.

Primary Examiner—R. Bruce Breneman
Assistant Examiner—Felisa Garrett
Attorney, Agent, or Firm—Samuels, Gauthier & Stevens

[57] ABSTRACT

In a method of selectively growing an Si epitaxial film, a gas consisting of not less than one type of a gas containing at least silane gas is used as a source gas. A substrate obtained by partially forming an insulating film pattern on a single-crystal Si substrate is heated to a predetermined temperature in a vacuum. An Si epitaxial film is grown on exposed single-crystal Si except for the insulating film pattern. Intermittent irradiation by vacuum ultraviolet light on the heated substrate is performed at predetermined time intervals.

6 Claims, 6 Drawing Sheets

METHOD OF SELECTIVELY GROWING SI EPITAXIAL FILM

BACKGROUND OF THE INVENTION

The present invention relates to a method of growing Si epitaxial films.

Recently, it has become impossible to realize super semiconductor devices of the next generation with an ultra-high integration degree and an ultra-high speed by merely miniaturizing conventional semiconductor device structures. Therefore, it is essential to develop new device structures.

A method in which an automatically positioned pattern is formed in a specific region on a substrate without using any lithographic techniques is called self-alignment. This self-alignment is a crucial technique in the fabrication of semiconductor devices, since it not only can simplify the fabrication process steps but also gives a large degree of freedom in designing fine device structures.

This self-alignment technique is also widely used in selective growth of Si epitaxial films, which is the object of the present invention. This technique has the advantages of being able to vary the impurity distribution of an active region and increase the degree of freedom in process design. In recent years, therefore, attempts using the techniques for selectively growing Si epitaxial thin films have been made vigorously in searching for and effectuating new device structures. As an example, high-speed Si bipolar transistors having a very thin base layer have been studied and developed extensively. As a technique for forming this base layer, a selective growth method which employs gas source molecular beam epitaxy using silane gas as an Si Source has been proposed (e.g., H. Hirayama et al., "Journal of Applied Physics," 1988, Vol. 52, pp. 2242 and 2243).

By using the fact that the Si surface is more chemically active than the $SiO_2$ surface in an ultra-high vacuum, this method causes silane gas to be dissociatively adsorbed only on the Si surface. Hydrogen atoms in the silane gas molecules thus dissociatively adsorbed are desorbed by heat, so only Si atoms remain on the substrate. This makes epitaxial growth of Si feasible. The result is selectivity by which a Si film is epitaxially grown only on the Si surface and no Si is grown on $SiO_2$ provided that the growth time is within a predetermined time period.

Consequently, the use of this method simplifies the fabrication process and makes it possible to form fine base-emitter junction portions with a high accuracy. Additionally, since a gas in the molecular beam state is used as the Si source, a high film thickness controllability can be attained.

In the above selective growth method using the gas source molecular beam epitaxy, however, the $SiO_2$ surface is not perfectly inactive. Therefore, if the time of selective growth is prolonged, dissociative adsorption of silane gas gradually takes place on the $SiO_2$ surface as well as on the exposed Si surface, and nucleation of Si proceeds on the $SiO_2$ surface. Eventually, poly-Si is deposited on that surface and the selectivity collapses. In other words, the use of this selective growth method imposes a limitation on the thickness of Si epitaxial films that can be selectively grown.

Moreover, the nucleation rate on the $SiO_2$ surface abruptly increases at temperatures of about 550° to about 800° C. at which a good crystallinity can be obtained and the thermal influence on device structures is insignificant. To obtain selectivity, therefore, it is necessary to largely decrease the supply amount of silane gas as an Si supply source per unit time, and this greatly decreases the growth rate. Consequently, the thickness of Si epitaxial films which can be selectively grown is further decreased.

These disadvantages discussed above are serious problems in using the selective growth method employing the gas source molecular beam epitaxy in the semiconductor fabrication processes.

SUMMARY OF THE INVENTION

It is, therefore, a principal object of the present invention to provide a method of selectively growing a Si epitaxial film, which can form a self-aligned arrangement of an Si device over a wide range of the substrate temperature with a high stability, while maintaining a high degree of freedom in fabrication conditions.

To achieve the above object, the present invention provides a method of selectively growing a Si epitaxial film, in which a gas consisting of one or more types of gases containing at least silane gas is used as a source gas, a substrate obtained by partially forming an insulating film pattern on a single-crystal Si substrate is heated to a predetermined temperature in a vacuum, and a Si epitaxial film is grown on exposed single-crystal Si except for the insulating film pattern, wherein intermittent irradiation by vacuum ultraviolet light on the heated substrate is performed at predetermined time intervals.

DESCRIPTION OF THE PREFERRED EMBODIMENT

First, the basic principle of the present invention will be described below.

It is known that molecules of silane gas cause dissociative adsorption on a substrate due to heat. When the substrate temperature is set at 450° C. or higher at which hydrogen atoms in the molecules of silane gas are desorbed as hydrogen molecules from the surface of a substrate, only Si atoms remain on the substrate. This makes epitaxial growth of Si possible.

Generally, dissociative adsorption of silane gas requires chemically active dangling bonds to exist on the surface of a substrate. In an ultra-high vacuum, a large number of dangling bonds are present on the Si surface, and so the surface is chemically active to silane gas. On the other hand, the number of dangling bonds on the $SiO_2$ surface is small, and this decreases the activity to silane gas. That is, a large amount of silane gas is dissociatively adsorbed only on the Si surface to form nuclei of Si epitaxial growth. This allows selective epitaxial growth using gas source molecular beam epitaxy.

Dangling bonds, however, also exist on the $SiO_2$ surface, albeit in a small number, so dissociative adsorption of silane gas gradually proceeds on that surface. That is, Si nuclei are produced even on the $SiO_2$ surface after a predetermined incubation period. This finally forms a poly-Si film and the selectivity collapses. In such selective epitaxial growth essentially using a thermal reaction alone, deposition of poly-Si on $SiO_2$ is unavoidable. Therefore, the film thickness of selective Si epitaxial films obtained depends upon the growth time before the selectivity collapses.

To perform selective growth by which no upper limit is imposed on the film thickness of resultant selective epitaxial films, Si nuclei gradually produced on $SiO_2$ during selective growth must be completely removed before formation of a continuous poly-Si film takes place, so that no poly-Si film is formed on $SiO_2$. The removal of Si nuclei is preferably performed by using a photochemical reaction, since the reaction proceeds at low temperatures without damaging a Si or $SiO_2$ film on a substrate and the controllability of the reaction is also high.

Si nuclei formed on an underlying $SiO_2$ film can be removed by causing the photochemical reaction between the $SiO_2$ film and the Si nuclei by using irradiation of light. In this case, a wavelength at which both Si and $SiO_2$ are electrically excited with a high efficiency and no vibrational excitation is brought about (i.e., no temperature rise is caused) must be chosen as the wavelength of a light source of excitation. Wavelength bands in which Si and $SiO_2$ are best electrically excited with light are 700 to 3000 nm and 300 to 1500 nm, respectively, from the full widths at half maximum (FWHM) of their respective absorption peaks. A wavelength band in which both Si and $SiO_2$ are electrically excited efficiently is a vacuum ultraviolet region of 700 to 1500 nm. An example of a high-intensity light source in this region is synchrotron radiation (SR). Synchrotron radiation is a light source which is obtained from an electron storage ring accelerated to nearly the velocity of light and has high intensities in an X-ray region to a vacuum ultraviolet region. As an example, synchrotron radiation obtained from a storage ring with an acceleration energy of 2.5 GeV, an electron orbital radius of 8.66 mm, and an applied magnetic field of 0.96 Tesla has a wavelength band of 20 to 1000 nm as an FWHM, and its total photon number is $3\times10^{17}$ photons/sec at a storage ring current of 300 mA. Therefore, both Si and $SiO_2$ can be electrically excited efficiently with vacuum ultraviolet light obtained by synchrotron radiation.

Figure 1:
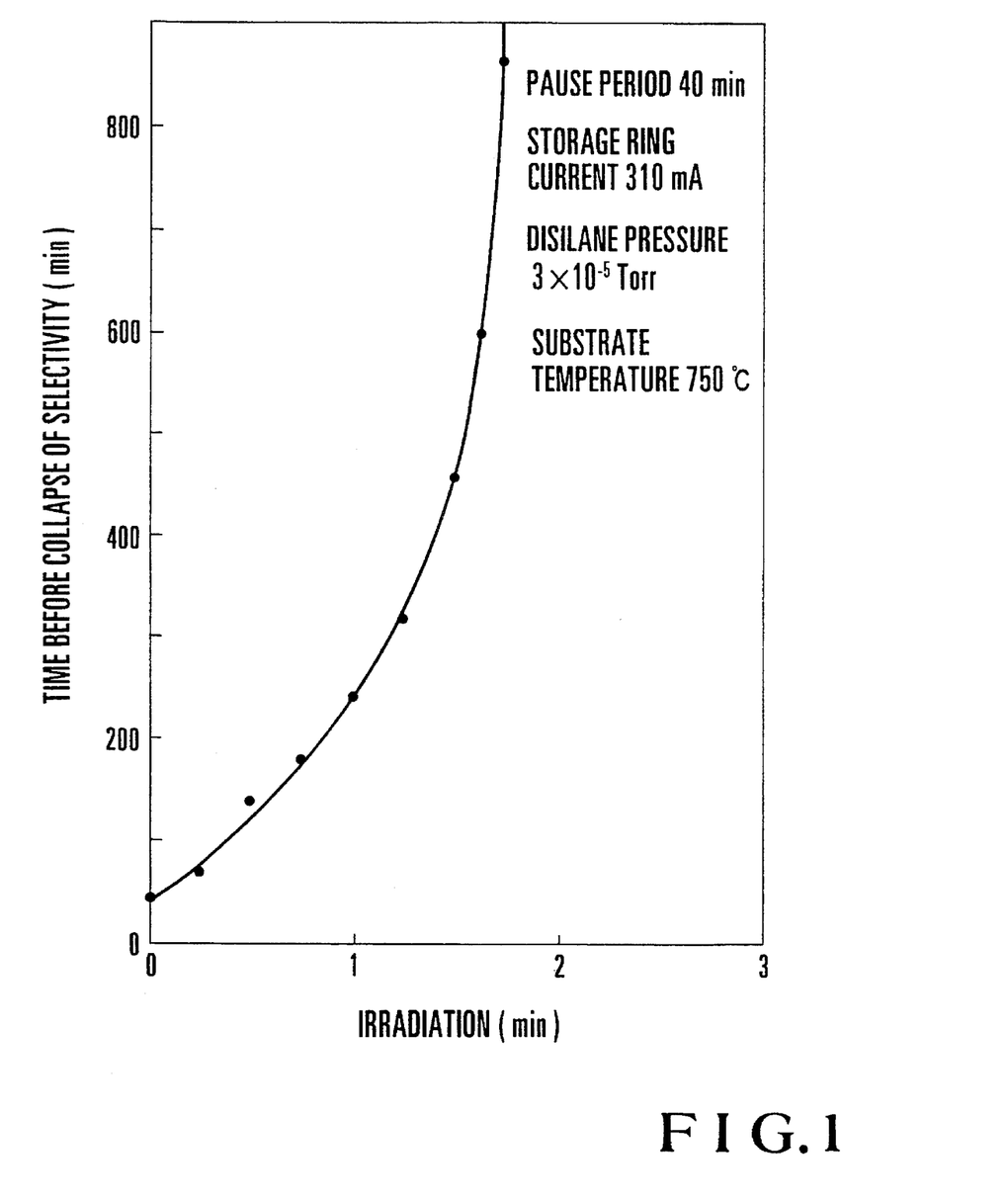
FIG. 1 is a graph showing the change in time before collapse of selectivity as a function of the change in irradiation time when two-minute irradiation by synchrotron radiation was intermittently performed at pause periods of 40 minutes, at a substrate temperature of 750° C. and a disilane pressure of $3\times10^{-5}$ Torr.

FIG. 1 is a graph showing the change in time before selectivity collapsed as a function of the change in irradiation time when irradiation by synchrotron radiation (storage ring current 310 mA) was intermittently performed at pause periods of 40 minutes, at a substrate temperature of 750° C. and a disilane pressure in a reaction bath of $3\times10^{-5}$ Torr. The pause period of 40 minutes is a time enough to produce Si nuclei on $SiO_2$ but not enough to form a continuous film of poly-Si. If Si nuclei produced on the surface of $SiO_2$ are not completely removed by irradiation by synchrotron radiation, mutual fusion and growth of the nuclei occur as the growth time elapses, and eventually the selectivity collapses. However, as in FIG. 1, it was found that the selectivity remained permanently if the irradiation time was set to two minutes or longer. In addition, supply of disilane was stopped when the pause period of 40 minutes elapsed, and the substrate was left to stand at 750° C. without synchrotron radiation. Consequently, the size of the Si nuclei formed on the $SiO_2$ surface remained unchanged even after an elapse of 30 hours. That is, Si nuclei cannot be removed by heat. This demonstrates that the Si nuclei produced on the $SiO_2$ surface during the pause period are completely removed by irradiation by synchrotron radiation.

The reason for this can be considered that the deposited poly-Si and the underlying $SiO_2$ react with each other as follows:

$$Si + SiO_2 + h\nu \rightarrow 2SiO\uparrow$$

in accordance with a photo-induced solid phase reaction caused by radiation, and consequently the poly-Si on the $SiO_2$ evaporates as SiO.

As discussed above, the growth in which the selectivity remained permanently could be effectuated by intermittently emitting synchrotron radiation on the surface of $SiO_2$.

Figure 2:
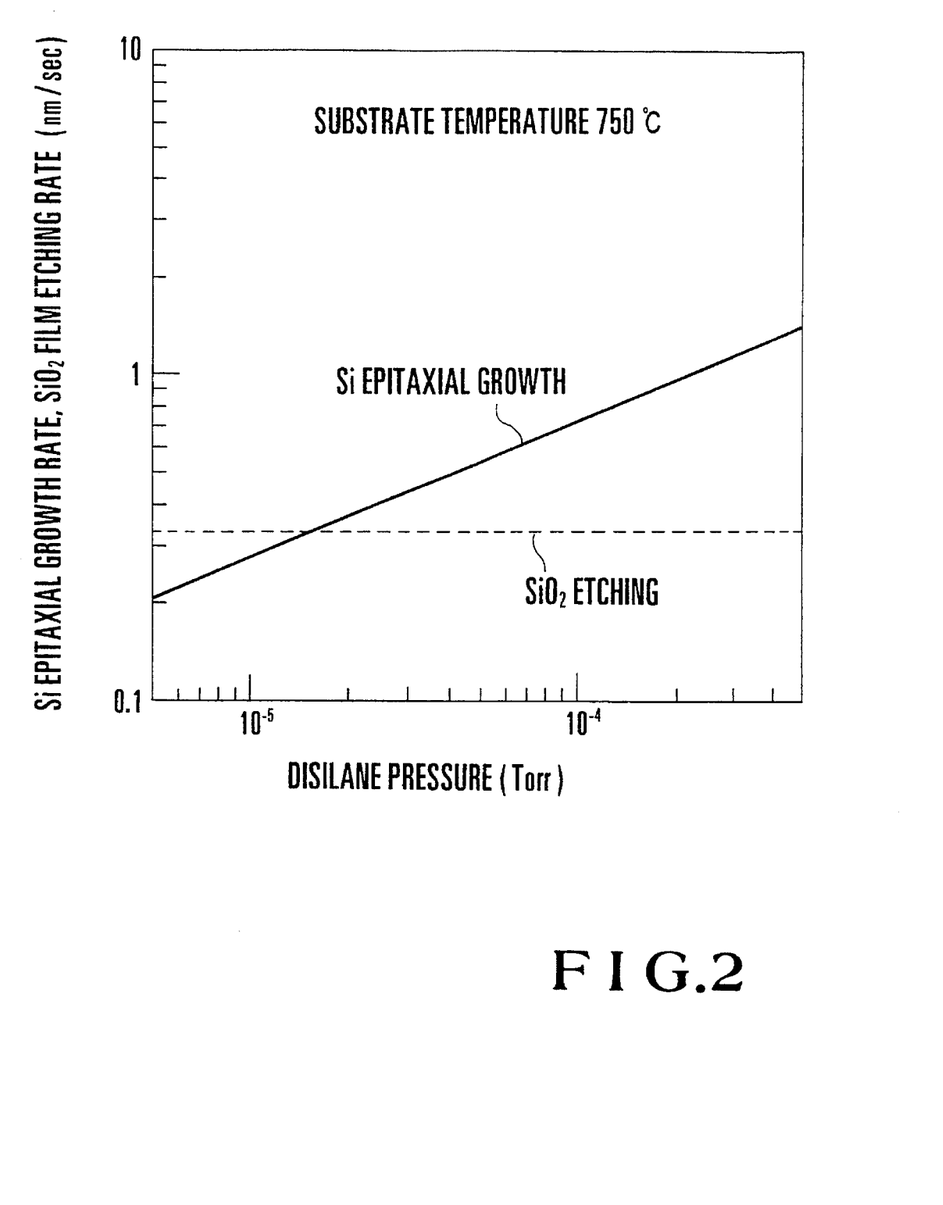
FIG. 2 is a graph showing the disilane pressure dependence of both the growth rate of Si epitaxial growth on Si and the rate of $SiO_2$ etching performed using synchrotron radiation at a substrate temperature of 750° C.

It is known that, when irradiation by synchrotron radiation on $SiO_2$ is performed, etching takes place due to photostimulated evaporation by synchrotron radiation (e.g., H. Akazawa et al., "Applied Physics Letters," 1990, Vol. 57, pp. 2302 to 2304). The present inventors actually made an experiment by continuous irradiation by synchrotron radiation (peak wavelength=100 nm, total photon number =$3\times10^{17}$ photons) on a Si substrate with a $SiO_2$ pattern by introducing disilane gas into an ultra-high vacuum bath. FIG. 2 shows the disilane pressure dependence of both the Si epitaxial growth rate on the Si substrate and the etching rate of the $SiO_2$ film resulting from irradiation of the synchrotron radiation at a substrate temperature of 750° C. As in FIG. 2, the Si epitaxial growth rate increased as the disilane pressure increased, but the etching rate of the $SiO_2$ remained constant. This $SiO_2$ etching rate is equal to or higher than the epitaxial growth rate in a low-disilane-pressure region, largely interfering with selective epitaxial growth. That is, the thickness of a thin Si film is limited. It is therefore essential to decrease the etching amount. As in FIG. 1, the etching amount of $SiO_2$ can be minimized by decreasing the irradiation time relative to the growth time of the selective Si film by performing irradiation intermittently. This increases the degree of freedom in applying the process. As described above, by intermittently performing irradiation of synchrotron radiation on the $SiO_2$ surface, it is possible to stably realize selective epitaxial growth over a wide temperature range regardless of the growth time, in which a decrease of $SiO_2$ film thickness of a $SiO_2$ pattern caused by photostimulated evaporation is significantly suppressed.

As has been mentioned above, the use of the method of selectively growing a Si epitaxial film according to the present invention makes it possible to stably realize a self-aligned arrangement of a Si device with a high film thickness controllability and a high position controllability, while keeping a high degree of freedom in the fabrication conditions. That is, selective epitaxial growth in which no upper limit is imposed on the film thickness of Si epitaxial films is made feasible over a wide temperature range with a high degree of freedom in process design.

Figure 3:
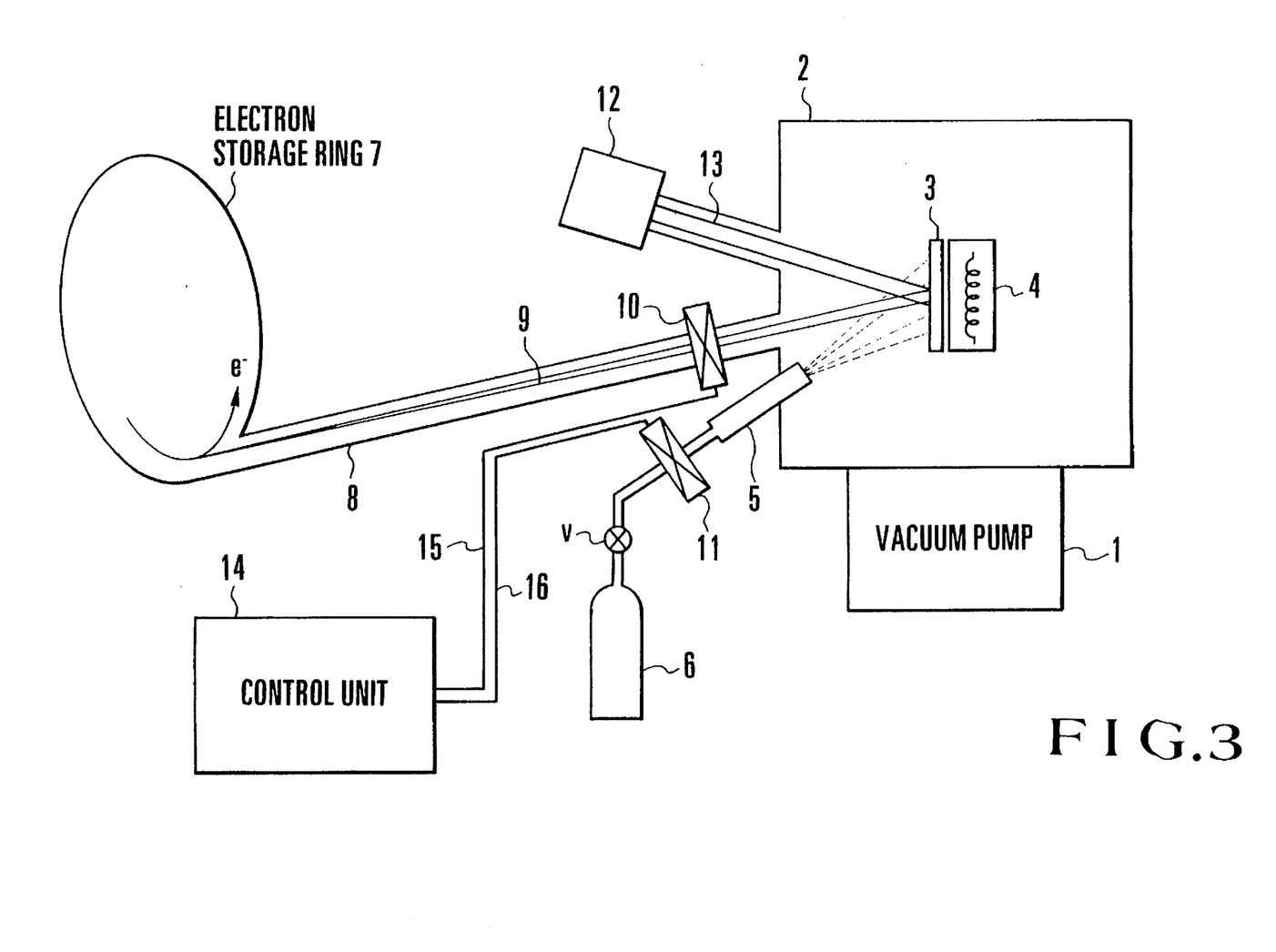
FIG. 3 is a block diagram of an apparatus for explaining the embodiment of the present invention.

The present invention will be described in more detail below with reference to the accompanying drawings. FIG. 3 is a block diagram of an apparatus for explaining an embodiment of the present invention. In this embodiment, a Si substrate with a (100) plane, on a portion of which a $SiO_2$ film pattern is formed, is used, and epitaxial growth of Si is selectively performed on a portion except for the $SiO_2$ film pattern, i.e., only on a Si exposed portion, over a wide temperature range. FIG. 3 schematically illustrates an apparatus using disilane as silane gas and synchrotron radiation as vacuum ultraviolet light for irradiation on a Si substrate. In this apparatus, a Si substrate 3 on a portion of which a $SiO_2$ pattern is formed is placed in a growth chamber 2 having a vacuum pump 1, and is heated to a predetermined temperature by a heating mechanism 4. While the Si substrate is in this heated state, disilane gas charged in a disilane cylinder 6 is supplied from a gas nozzle 5 to the surface of the Si substrate 3 by opening a gas valve 11. In this case, the Si substrate 3 can be heated rapidly with little gas removal from the peripheral portion of the substrate by irradiation by infrared light 13 from an infrared generating unit 12. Synchrotron radiation 9 generated by an electron storage ring 7 is introduced into the growth chamber 2 through a vacuum duct 8. Irradiation by the synchrotron radiation 9 is then performed on the surface of the Si substrate 3 at predetermined time intervals by opening/closing a valve 10 which intercepts irradiation. The synchrotron radiation used in this embodiment was obtained from a storage ring with an acceleration energy of 2.5 GeV, an electron orbital radius of 8.66 m, and an applied magnetic field of 0.96 T and had a wavelength band of 20 to 1000 nm as a full width at half maximum. The total photon number of the radiation was $3\times10^{17}$ photons/sec at a storage ring current of 300 mA.

Note that while irradiation by the synchrotron radiation 9 on the substrate 3 is performed by opening the irradiation intercepting valve 10, the gas valve 11 is so controlled as to be throttled or completely closed. During irradiation by the synchrotron radiation 9 on the substrate, the supply quantity of the disilane gas is reduced to the order of $10^{-7}$ Torr or less, or the supply of the disilane gas is stopped.

Figure 4:
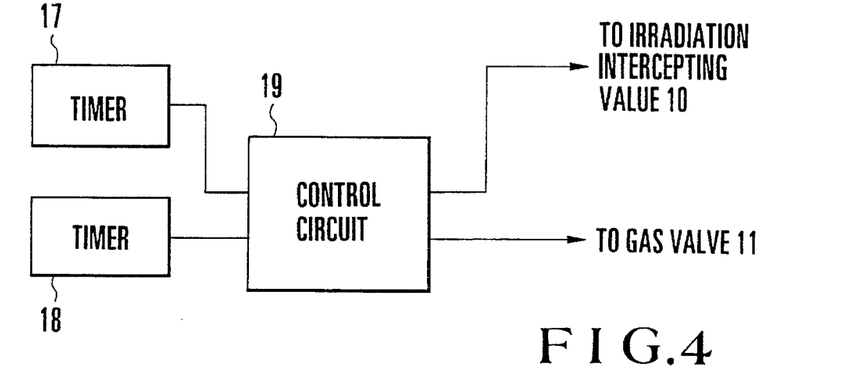
FIG. 4 is a block diagram showing a control unit for controlling opening/closing of a valve which intercepts irradiation and a gas valve.

This is to prevent the synchrotron radiation 9 from exciting the disilane gas to produce a vapor phase decomposed species, such as $Si^+$ or $SiH^+$, which in turn deposits on a nonirradiated portion to form a poly-Si film. By decreasing the supply quantity of the disilane gas to the order of $10^{-7}$ Torr or less, the production quantity of the vapor phase decomposed species can be decreased to one several hundredth. The opening/closing of the irradiation intercepting valve 10 and the gas valve 11 is electrically controlled by a control unit 14 through signal lines 15 and 16. In FIG. 3, reference symbol v denotes a valve attached to the opening of the disilane cylinder 6. FIG. 4 is a block diagram showing the control unit. In FIG. 4, reference numerals 17 and 18 denote timers for setting the time interval during which the irradiation intercepting valve 10 is open and the time interval during which the gas valve 11 is open, respectively; and 19, a control circuit for converting the output signals from the timers into the opening/closing input signals for the irradiation intercepting valve 10 and the gas valve 11, and for operating the timers 17 and 18 in a predetermined order.

The range of a pause period during the intermittent irradiation is described below. A maximum value of this pause period is the one immediately before a continuous film of poly-Si is formed on $SiO_2$. This value can be determined by checking the electrical conductance on the surface of $SiO_2$. If Si nuclei alone are formed on the $SiO_2$ surface, no electrical conductance exists on the surface. However, electrical conductance takes place if a continuous poly-Si film is formed. Therefore, the pause period is set to a time before this occurs. A minimum value of the pause period (the disilane gas supply time) during the intermittent irradiation is the value at which one atomic layer of an epitaxial Si film is formed. A gas need be supplied until one atomic layer of an epitaxial Si film is formed in order to prevent degradation of the crystallinity of an epitaxial film by maintaining two-dimensional growth at any instant; that is, in order to prevent impurities in the growth atmosphere from adhering to different crystal faces to produce various lattice defects. For example, the disilane gas was introduced into the growth chamber 2 until the vacuum degree in the chamber became $3.0\times10^{-5}$ Torr in this embodiment. In this case, one atomic layer of a Si epitaxial film took 3.2 seconds to grow on the Si substrate (see FIG. 2). Since the irradiation intercepting valve 10 is of pneumatic type, its opening/closing time is 1.5 seconds. Therefore, if a time required for one atomic layer of a Si epitaxial film to grow is within 1.5 seconds, the minimum value of the pause period (the disilane gas supply time) during the intermittent irradiation depends upon the opening/closing time of the irradiation intercepting valve 10. The irradiation time during the intermittent irradiation is set to a time within which Si nuclei formed on $SiO_2$ during the pause period can be completely removed.

The synchrotron radiation used in this embodiment has a peak at 100 nm over a wavelength range of 30 to 1500 nm. The radiated photon quantity was $3\times10^{17}$ photons/sec. The irradiation of the synchrotron radiation was performed intermittently at pause periods of 40 minutes. This pause period of 40 minutes is a time enough to produce Si nuclei on $SiO_2$, but not enough to form a continuous poly-Si film. That is, at a high substrate temperature of 750° C., the selectivity can be maintained only for 40 minutes by a thermal reaction alone. However, all Si nuclei formed on $SiO_2$ can be removed by irradiation by synchrotron radiation on $SiO_2$ for two minutes or longer. This permits perfect selective growth in which selectivity does not collapse.

Figure 5:
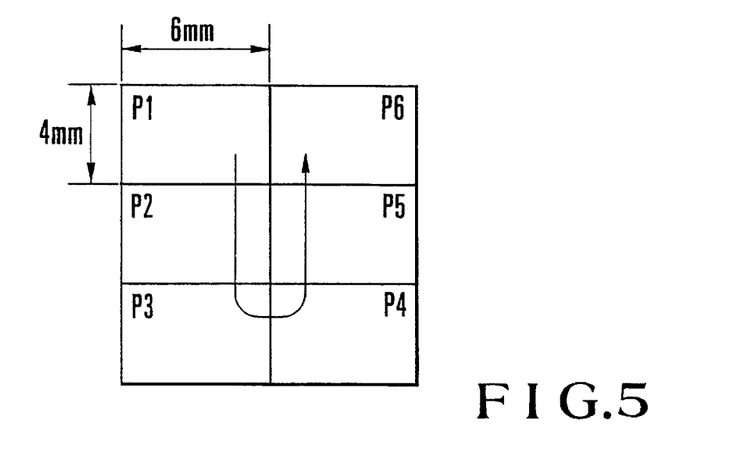
FIG. 5 is a schematic view showing the order of scanning the irradiation position when perfect selective growth was performed on a large area of 12 mm ×12 mm by scanning a synchrotron radiation beam with cross-sectional dimensions of 4 mm ×6 mm used in the embodiment.
Figure 6:
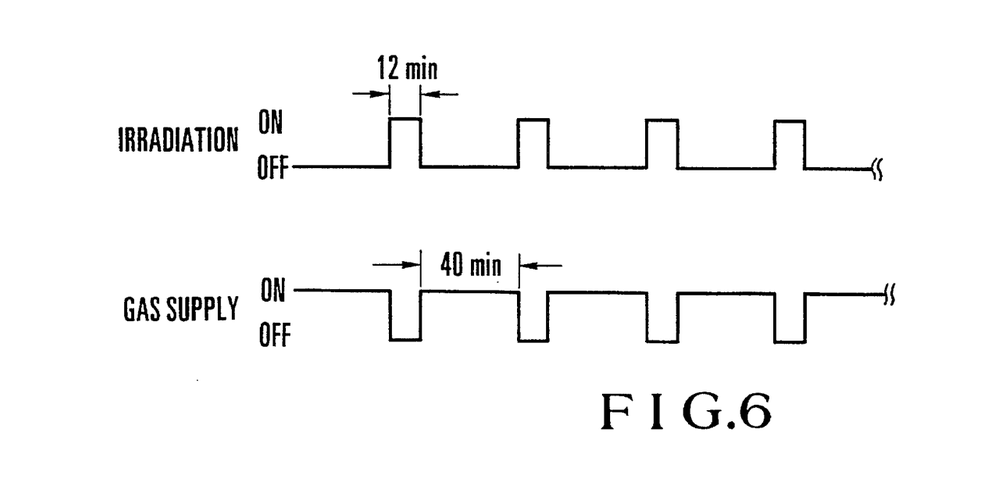
FIG. 6 is a timing chart showing intermittent irradiation and intermittent gas supply when the irradiation position is scanned.

In this selective epitaxial growth, it is possible to effect selective growth in a larger area by sequentially moving a region on a substrate, which is to be irradiated for a predetermined time, each time two-minute irradiation is ended. FIG. 5 is a view showing the order of scanning the irradiation position when perfect selective growth was performed in a large area of 12 mm ×12 mm by scanning the synchrotron radiation beam with cross-sectional dimensions of 4 mm×6 mm used in this embodiment. Referring to FIG. 5, irradiation is performed for two minutes for each of positions (P1) to (P6), and the irradiation region is moved in the direction of the arrow. Therefore, the irradiation time is 12 minutes in total. FIG. 6 is a timing chart showing the timings of intermittent irradiation and intermittent gas supply when the irradiation position is scanned in this way. In this case, it is possible to perform one of two scanning methods, (1) a method of moving the substrate and (2) a method of moving the light beam.

Figure 7:
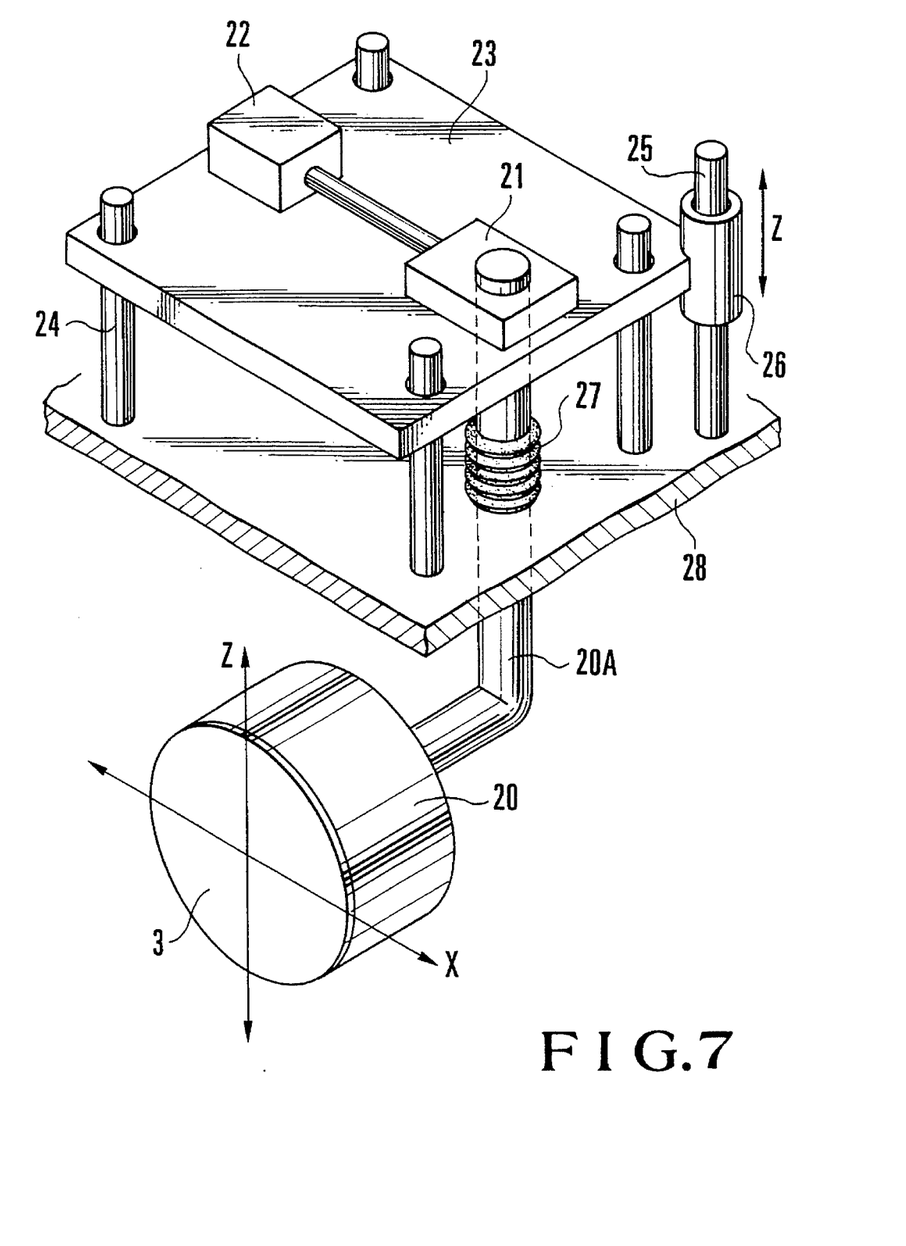
FIG. 7 is a perspective view showing a mechanism for moving a substrate along two orthogonal directions in the same plane.

FIG. 7 illustrates a mechanism for moving the substrate 3 along two orthogonal directions in the same plane. A holder 20 with a heating mechanism, on which the substrate 3 is mounted, is connected to an X-direction moving stage 21 by a support rod 20A. This X-direction moving stage 21 is moved in the X direction on a stage 23 by a driving mechanism 22. The stage 23 is moved together with the stage 21 in the Z direction by a driving mechanism 26 along movement guide rods 24 and 25 fixed on a wall 28 of the growth chamber (2 in FIG. 3) of the apparatus of this embodiment. Although the holder 20 protrudes outside the growth chamber, vacuum sealing is performed by using a bellows 27.

Figure 8:
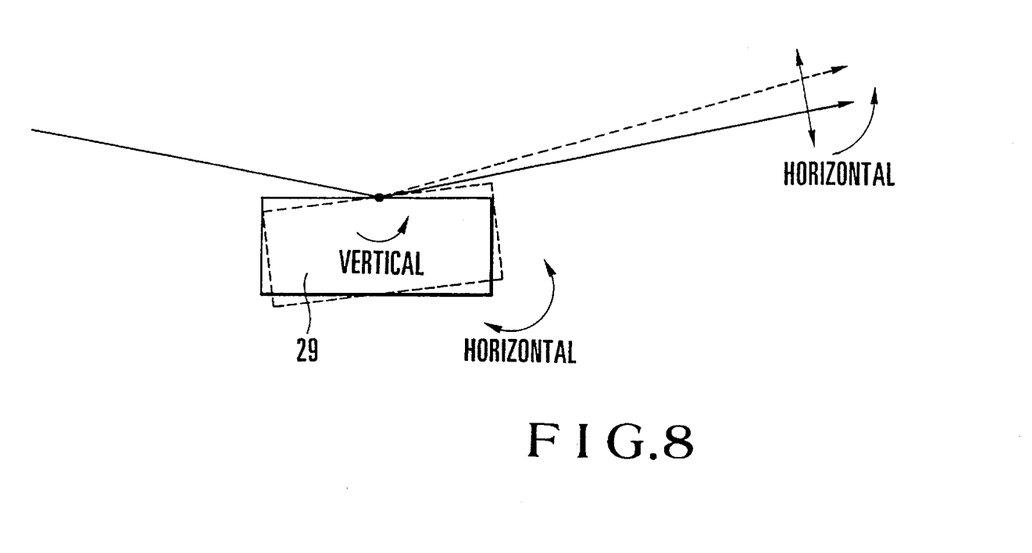
FIG. 8 is a schematic view for explaining how to move light along two orthogonal directions in the same plane while a substrate is fixed.

FIG. 8 is a view for explaining how to move light along two orthogonal directions (vertical and horizontal directions) in the same plane while the substrate is fixed. A mirror 29 for changing the optical path of the synchrotron radiation 9 is arranged in the vacuum duct 8 shown in FIG. 3. By rotating this mirror 29 along the vertical and horizontal directions in the same plane, the position on the substrate to be irradiated with the synchrotron radiation 9 can be moved in the vertical and horizontal directions. In this case, as in the example shown in FIG. 5, it is only necessary to change the irradiation position by rotating the mirror 29 in a desired direction each time irradiation for one position is ended. The rotating mechanism of this mirror 29 is, in principle, that the mirror is pulled with a string and the position at which the string is pulled is moved in the vertical and horizontal directions. However, it is also possible to use a well-known rotating mechanism for moving a mirror in the vertical and horizontal directions.

Figure 9:
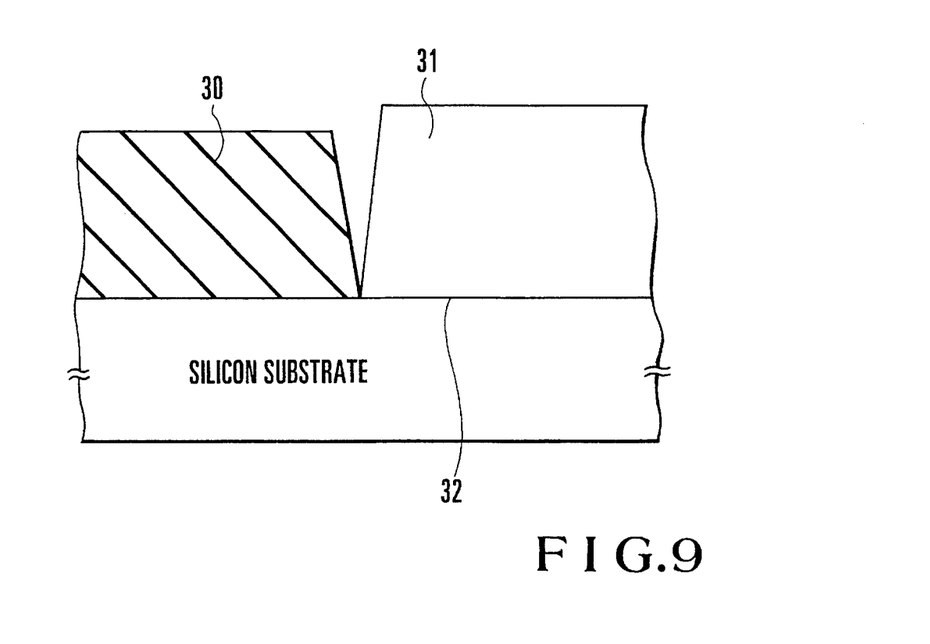
FIG. 9 is a cross-sectional view showing a Si substrate obtained by the apparatus in FIG. 3.

To confirm the effect of the present invention, selective epitaxial growth was actually carried out for 400 minutes by using the apparatus shown in FIG. 3 under the growth conditions of substrate temperature 750° C. and disilane pressure $3.0 \times 10^{-5}$ Torr. FIG. 9 is a schematic view showing the cross-sectional structure of the resultant Si substrate 3 observed by a scanning electron microscope. It is evident from this result that in the method of selectively growing a Si epitaxial film using disilane according to the present invention, a Si film 31 about 820 nm thick was epitaxially grown on a Si substrate exposed portion 32, but no Si film was grown on a $SiO_2$ pattern 30. This indicates that perfect selective growth was done.

In this embodiment, disilane gas was used as the molecular beam source. However, the method of the present invention is similarly applicable to a case where another silane gas such as silane ($SiH_4$), trisilane ($Si_3H_8$), or dichlorosilane ($SiCl_2H_2$) is used as a source gas, or a gas mixture of a doping gas, such as diborane ($B_2H_6$) or phosphine ($PH_4$), and silane gas is used as a source gas. In addition, as in FIG. 3, a substrate in which a $SiO_2$ pattern was partially formed on a single-crystal Si substrate was used as the substrate 3 for selective epitaxial growth in this embodiment. However, the method of the present invention can also be performed by using a substrate in which a pattern of another insulating film, e.g., a nitride film is formed on a single-crystal Si substrate.

Furthermore, synchrotron radiation was used as the light source in this embodiment. However, it is also possible to carry out the method of the present invention by using a plasma vacuum ultraviolet source or a laser plasma vacuum ultraviolet source having a similar wavelength band, although the intensity of such light source is slightly low.

What is claimed is:

1. A method of selectively growing a Si epitaxial film, in which a gas consisting of not less than one type of a gas containing at least silane gas is used as a source gas, a substrate obtained by partially forming an insulating film pattern on a single-crystal Si substrate is heated to a selected temperature in a vacuum, and a Si epitaxial film is grown on exposed single-crystal Si except for said insulating film pattern, wherein intermittent irradiation by vacuum ultraviolet light, from a vacuum ultraviolet light source, on said heated substrate is performed at selected time intervals of irradiation and non-irradiation, said time intervals of non-irradiation being of a duration so as to avoid the formation of poly-Si on said insulating film pattern.

2. A method according to claim 1, wherein a position on said heated substrate to be irradiated with the vacuum ultraviolet light is moved.

3. A method according to claim 2, wherein a pressure of the source gas is reduced while irradiation by the vacuum ultraviolet light on said heated substrate is performed.

4. A method according to claim 1, wherein a pressure of the source gas is reduced while irradiation by the vacuum ultraviolet light on said heated substrate is performed.

5. A method according to claim 1, wherein supply of the source gas is stopped while irradiation by the vacuum ultraviolet light on said heated substrate is performed.

6. A method according to claim 1, wherein synchrotron radiation is used as the vacuum ultraviolet light.

\* \* \* \* \*